US 9,362,218 B2

United States Patent
Kim et al.

(10) Patent No.: US 9,362,218 B2
(45) Date of Patent: Jun. 7, 2016

(54) INTEGRATED PASSIVE DEVICE (IPD) ON SUBSTRATE

(71) Applicant: QUALCOMM Incorporated, San Diego, CA (US)

(72) Inventors: Daeik Daniel Kim, San Diego, CA (US); Young Kyu Song, San Diego, CA (US); Changhan Hobie Yun, San Diego, CA (US); Mario Francisco Velez, San Diego, CA (US); Chengjie Zuo, Santee, CA (US); Jonghae Kim, San Diego, CA (US); Xiaonan Zhang, San Diego, CA (US); Ryan David Lane, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 201 days.

(21) Appl. No.: 13/968,627

(22) Filed: Aug. 16, 2013

(65) Prior Publication Data

US 2015/0048480 A1    Feb. 19, 2015

(51) Int. Cl.
  *H01L 23/498* (2006.01)
  *H01L 21/768* (2006.01)
  *H01L 49/02* (2006.01)
  *H01L 23/50* (2006.01)
  *H01L 23/64* (2006.01)
  *H01L 23/522* (2006.01)

(52) U.S. Cl.
  CPC .... *H01L 23/49827* (2013.01); *H01L 21/76885* (2013.01); *H01L 23/49816* (2013.01); *H01L 23/50* (2013.01); *H01L 28/10* (2013.01); *H01L 28/20* (2013.01); *H01L 28/40* (2013.01); *H01L 23/5222* (2013.01); *H01L 23/642* (2013.01); *H01L 2224/16225* (2013.01); *H01L 2225/06572* (2013.01); *H01L 2924/19105* (2013.01)

(58) Field of Classification Search
  CPC .............. H01L 23/5222; H01L 23/642; H01L 23/49827
  See application file for complete search history.

(56) References Cited

U.S. PATENT DOCUMENTS 5,530,288 A    6/1996  Stone
6,822,169 B2  11/2004  Kataoka
7,027,289 B2   4/2006  He et al.
(Continued)

FOREIGN PATENT DOCUMENTS

EP    1154481 A2   11/2001
EP    1691414 A2    8/2006

OTHER PUBLICATIONS

International Search Report and Written Opinion—PCT/US2014/050776—ISA/EPO—Jan. 12, 2015.

*Primary Examiner* — Ha Tran T Nguyen
*Assistant Examiner* — Aaron Dehne
(74) *Attorney, Agent, or Firm* — Loza & Loza, LLP

(57) ABSTRACT

Some novel features pertain to a semiconductor device that includes a substrate, a first cavity that traverses the substrate. The first cavity is configured to be occupied by a interconnect material (e.g., solder ball). The substrate also includes a first metal layer coupled to a first side wall of the first cavity. The substrate further includes a first integrated passive device (IPD) on a first surface of the substrate, the first IPD coupled to the first metal layer. In some implementations, the substrate is a glass substrate. In some implementations, the first IPD is one of at least a capacitor, an inductor and/or a resistor. In some implementations, the semiconductor device further includes a second integrated passive device (IPD) on a second surface of the substrate. The second IPD is coupled to the first metal layer.

30 Claims, 14 Drawing Sheets

(56) References Cited

U.S. PATENT DOCUMENTS

| | | |
|---|---|---|
| 7,233,061 B1 | 6/2007 | Conn |
| 2003/0086248 A1* | 5/2003 | Mashino ................ 361/767 |
| 2006/0180938 A1* | 8/2006 | Kurihara et al. ............ 257/773 |
| 2008/0224292 A1 | 9/2008 | Hui et al. |
| 2009/0267183 A1 | 10/2009 | Temple et al. |
| 2012/0261832 A1* | 10/2012 | Takano ............ H01L 23/49822 257/774 |

* cited by examiner

INTEGRATED PASSIVE DEVICE (IPD) ON SUBSTRATE

BACKGROUND

1. Field

Various features relate to an integrated passive device (IPD) on substrate.

2. Background

A capacitor is an example of an integrated passive device (IPD) that may be coupled to a die (e.g., semiconductor device) in a package. Such capacitors are typically used as decoupling capacitors in a Power Delivery Networks (PDNs) that are used to deliver power from a power supply/source to integrated circuits (ICs)/dies. PDNs inherently suffer from noise and/or resonance, which interfere with the ICs the PDNs are meant to power. Decoupling capacitors help avoid or minimize this interference by decoupling power supplies from the PDNs.

FIG. 1 illustrates a configuration of several decoupling capacitors on a printed circuit board (PCB). Specifically, FIG. 1 illustrates a printed circuit board (PCB) 100 that includes an integrated circuit (IC)/die 102. The PCB 100 and the IC/die 102 are part of a power delivery network (PDN). The IC/die 102 is coupled to the PCB 100 through a set of solder balls 104, which are located between the PCB 100 and the IC/die 102. FIG. 1 also illustrates a first decoupling capacitor 106 and a second decoupling capacitor 108. The first and second decoupling capacitors 106-108 are also part of the PDN and are coupled to a power source (not shown) of the PDN through a route 110.

The above configuration of decoupling capacitors takes up a lot of real estate and requires complicated board designs. As such, there is a need for an improved design for implementing decoupling capacitors or other IPDs (e.g., inductor) with an IC/die. Ideally, such a design will provide high density IPDs and will be less complicated than current decoupling capacitor designs and/or IPD designs.

SUMMARY

Various features, apparatus and methods described herein provide an integrated passive device (IPD) on substrate.

A first example provides a semiconductor device that includes a substrate, a first cavity that traverses the substrate. The first cavity is configured to be occupied by an interconnect material. The substrate also includes a first metal layer coupled to a first side wall of the first cavity. The substrate further includes a first integrated passive device (IPD) on a first surface of the substrate, the first IPD coupled to the first metal layer.

According to an aspect, the interconnect material is a solder ball.

According to one aspect, the first IPD is one of at least a capacitor, an inductor and/or a resistor.

According to an aspect, the semiconductor device further includes a second integrated passive device (IPD) on a second surface of the substrate. The second IPD is coupled to the first metal layer.

According to one aspect, the semiconductor device also includes a second metal layer that is coupled to a second side wall of the first cavity. The semiconductor device further includes a second integrated passive device (IPD) on the first surface of the substrate. The second IPD is coupled to the second metal layer. In some implementations, the first and second metal layers are the same.

According to an aspect, the semiconductor device is a wafer level package (WLP) semiconductor device configured to be coupled to an integrated circuit (IC) comprising an IPD pad and a ball pad. In some implementations, the first metal layer is configured to be coupled to the IPD pad of the IC.

According to one aspect, the first IPD is configured to be electrically coupled to the solder ball through the first metal layer when the semiconductor device is coupled to an integrated circuit (IC).

According to an aspect, the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides an apparatus that includes a substrate, and a first cavity traversing the substrate. The first cavity is configured to be occupied by an interconnect means. The apparatus also includes a first metal layer coupled to a first side wall of the first cavity, and a first means for integrated passive functionality on a first surface of the substrate. The first means coupled to the first metal layer.

According to an aspect, the interconnect means is a solder ball.

According to one aspect, the first means for integrated passive functionality is one of at least a capacitor, an inductor and/or a resistor.

According to an aspect, the apparatus further includes a second means for integrated passive functionality on a second surface of the substrate. The second means for integrated passive functionality is coupled to the first metal layer.

According to one aspect, the apparatus also includes a second metal layer coupled to a second side wall of the first cavity, and a second means for integrated passive functionality on the first surface of the substrate. The second means for integrated passive functionality coupled to the second metal layer. In some implementations, the first and second metal layers are the same.

According to an aspect, the apparatus is a wafer level package (WLP) semiconductor device configured to be coupled to an integrated circuit (IC) comprising an integrated passive device (IPD) pad and a ball pad. In some implementations, the first metal layer is configured to be coupled to the IPD pad of the IC.

According to one aspect, the first means for integrated passive functionality is configured to be electrically coupled to the interconnect means through the first metal layer when the apparatus is coupled to an integrated circuit (IC).

According to an aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a method for providing a semiconductor device. The method provides a substrate. The method provides a first cavity that traverses the substrate. The first cavity is configured to be occupied by an interconnect material. The method provides a first metal layer coupled to a first side wall of the first cavity. The method further provides a first integrated passive device (IPD) on a first surface of the substrate. The first IPD is coupled to the first metal layer.

According to an aspect, the interconnect material is a solder ball.

According to an aspect, the first IPD is one of at least a capacitor, an inductor and/or a resistor.

According to an aspect, the method further provide a second integrated passive device (IPD) on a second surface of the substrate. The second IPD is coupled to the first metal layer.

According to one aspect, the method further provides a second metal layer coupled to a second side wall of the first cavity. The method also provides a second integrated passive device (IPD) on the first surface of the substrate. The second IPD coupled to the second metal layer. In some implementations, the first and second metal layers are the same.

According to an aspect, the semiconductor device is a wafer level package (WLP) semiconductor device configured to be coupled to an integrated circuit (IC) comprising an IPD pad and a ball pad. In some implementations, the first metal layer is configured to be coupled to the IPD pad of the IC.

According to one aspect, the first IPD is configured to be electrically coupled to the interconnect material through the first metal layer when the semiconductor device is coupled to an integrated circuit (IC).

According to an aspect, the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to a semiconductor device that includes a substrate, a first cavity that traverses the substrate. The first cavity is configured to be occupied by an interconnect material (e.g., solder ball). The substrate also includes a first metal layer (e.g., first side metal layer) coupled to a first side wall of the first cavity. The substrate further includes a first integrated passive device (IPD) on a first surface (e.g., top surface) of the substrate, the first IPD coupled to the first meal layer (e.g., first side metal layer). In some implementations, the substrate is a glass substrate. In some implementations, the first IPD is one of at least a capacitor, an inductor and/or a resistor. In some implementations, the semiconductor device further includes a second integrated passive device (IPD) on a second surface (e.g., bottom surface) of the substrate. In some implementations, the second IPD is on the first surface (e.g., top surface) of the substrate. The second IPD is coupled to the first metal layer (e.g., first side metal layer). In some implementations, the semiconductor device also includes a second metal layer (e.g., second side metal layer) that is coupled to a second side wall of the first cavity. In some implementations, the first and second metal layers may be different or the same metal layer. In some implementations, the first metal layer (e.g., first side metal layer) and/or the second metal layer (e.g., second side metal layer) may be through substrate vias (TSVs) or through glass vias (TGVs). In some implementations, the semiconductor device is a wafer level package (WLP) semiconductor device configured to be coupled to an integrated circuit (IC) comprising an IPD pad and a ball pad. In some implementations, the first side metal layer is configured to be coupled to the IPD pad of the IC.

Exemplary Wafer Level Package (WLP) Semiconductor Device

Figure 1:
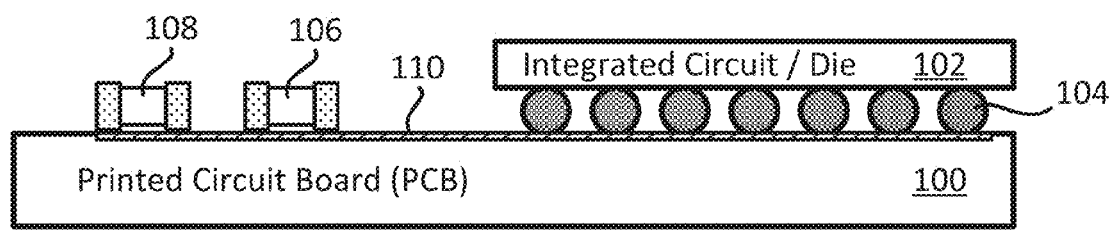
FIG. 1 illustrates how conventional capacitors are coupled to a die.
Figure 2:
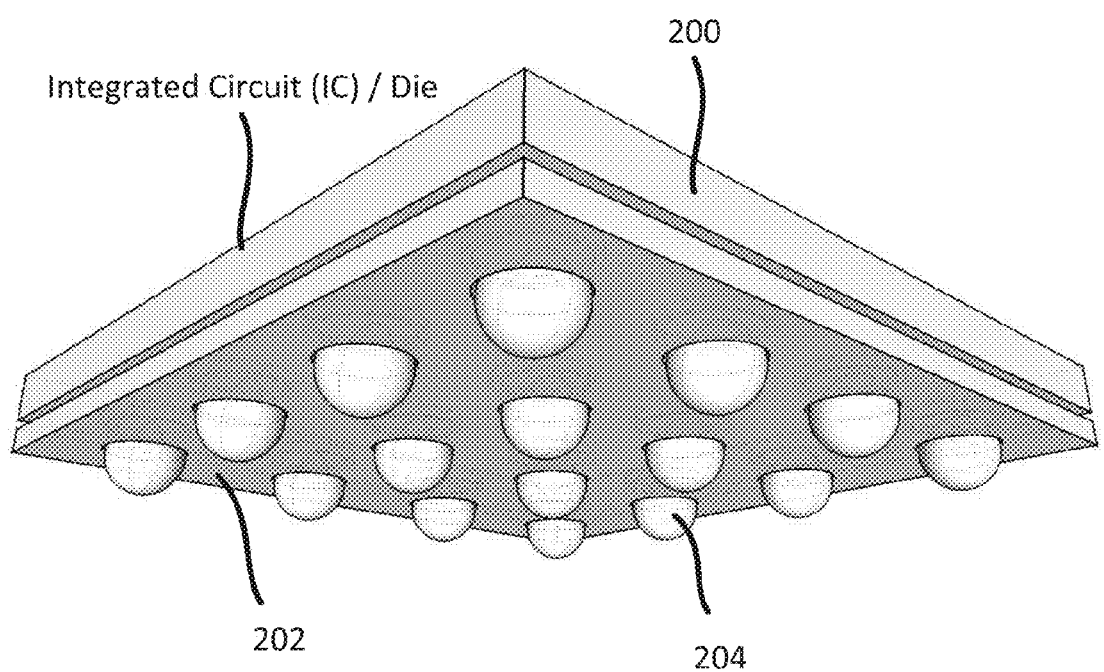
FIG. 2 illustrates an example of a semiconductor device that includes an integrated passive device (IPD).

FIG. 2 conceptually illustrates a die coupled to a novel semiconductor device in some implementations. As shown in FIG. 2, an integrated circuit (IC)/die 200 is coupled to a semiconductor device 202. In some implementations, the IC/die 200 is a wafer level package (WLP) that is manufactured using a wafer level process. In some implementations, the semiconductor device 202 is a wafer level package (WLP) semiconductor device (e.g., semiconductor device manufactured using a wafer level process). In some implementations, the semiconductor device 202 is an integrated passive device structure that includes one or more integrated passive devices (IPDs). Examples of IPDs include capacitors, inductors, and/or resistors. In some implementations, the integrated passive device structure is manufactured using a wafer level process.

FIG. 2 illustrates individual dies and/or semiconductor devices. In some implementations, these individual dies and/or semiconductor device are produced/manufactured from one or more wafers. That is, in some implementations, several dies (e.g., die 200) are manufactured on a wafer, which is then sliced/diced to produce individual dies (e.g., die 200). Similarly, in some implementations, several semiconductor devices (e.g., semiconductor device 202) are manufactured on a wafer, which is then sliced/diced to produce individual semiconductor devices (e.g., semiconductor device 202). Before further describing the die 200, the semiconductor device 202, and the solder balls 204, of FIG. 2, an exemplary wafer level process is described below.

In some implementations, a wafer level process is a wafer fabrication process that includes device interconnection and device protection processes before the dicing/slicing of the wafer into individual devices (e.g., die, semiconductor device, interposer). In some implementations, a wafer level process includes attaching top and bottom outer layers of a packaging, other semiconductor devices, and/or the solder balls (e.g., solder bumps), to integrated circuits while the integrated circuits are still in the wafer, and then dicing/slicing the wafer into individual devices (e.g., die, semiconductor device).

In some implementations, a wafer level process may includes coupling two wafers (e.g., a first wafer that includes integrated circuits and a second wafer that includes integrated passive devices (IPDs)), before dicing/slicing the wafers (e.g., dicing/slicing the first and second wafers at the same time). For example, in some implementations, a first wafer that includes several uncut dies (e.g., die 200) is coupled to a second wafer that includes several uncut semiconductor devices (e.g., semiconductor device 202). A set of solder balls (e.g., solder ball 204) may be coupled to the first wafer (before or after the coupling of the first wafer to the second wafer). In some implementations, once the first wafer is coupled to the second wafer, both wafers may be sliced/diced. In some implementations, once the first wafer is coupled to the second wafer, and the solder balls are coupled to the first wafer, the first and second wafers may be sliced/diced. It should be noted that the wafer level process described above is applicable to any of the dies and/or semiconductor devices described in the present disclosure. Having described an exemplary wafer level process, the die 200, the semiconductor device 202, and the solder balls 204 of FIG. 2 is further described below.

The semiconductor device 202 includes a substrate and several cavities/holes. The cavities/holes traverse the entire substrate. One or more of these cavities/holes are occupied with solder balls 204 (e.g., interconnect material). In some implementations, the combination of the die 200 and the solder balls 204 (e.g., interconnect material) is a wafer level package (WLP) that is manufactured using a wafer level process. In some implementations, the combination of the die 200, the semiconductor device 202, and the solder balls 204 (e.g., interconnect material) is a wafer level package (WLP) that is manufactured using a wafer level process. In some implementations, an interconnect material (e.g., solder ball) is a material configured to couple a first device (e.g., die, chip) to a second device (e.g., printed circuit board, interposer). In some implementations, the first and/or second device is a semiconductor device. The semiconductor device 202 includes a substrate (e.g., glass substrate) in some implementations. Different implementations may use different materials for the substrate. The semiconductor device 202 includes several integrated passive devices (IPDs), which are not visible. Examples of IPDs include capacitors, inductors, and/or resistors. More specific and detailed examples of substrates, cavities, and IPDs in the semiconductor device 202 will be further described in FIGS. 4, 5, 6 and 7 below.

Having described a wafer level package (WLP) semiconductor device that includes one or more integrated passive devices (IPDs), a general sequence for providing and/or coupling a WLP semiconductor device to a die (which may also be a wafer level package) will now be described in FIGS. 3A-3B.

Figure 3A:
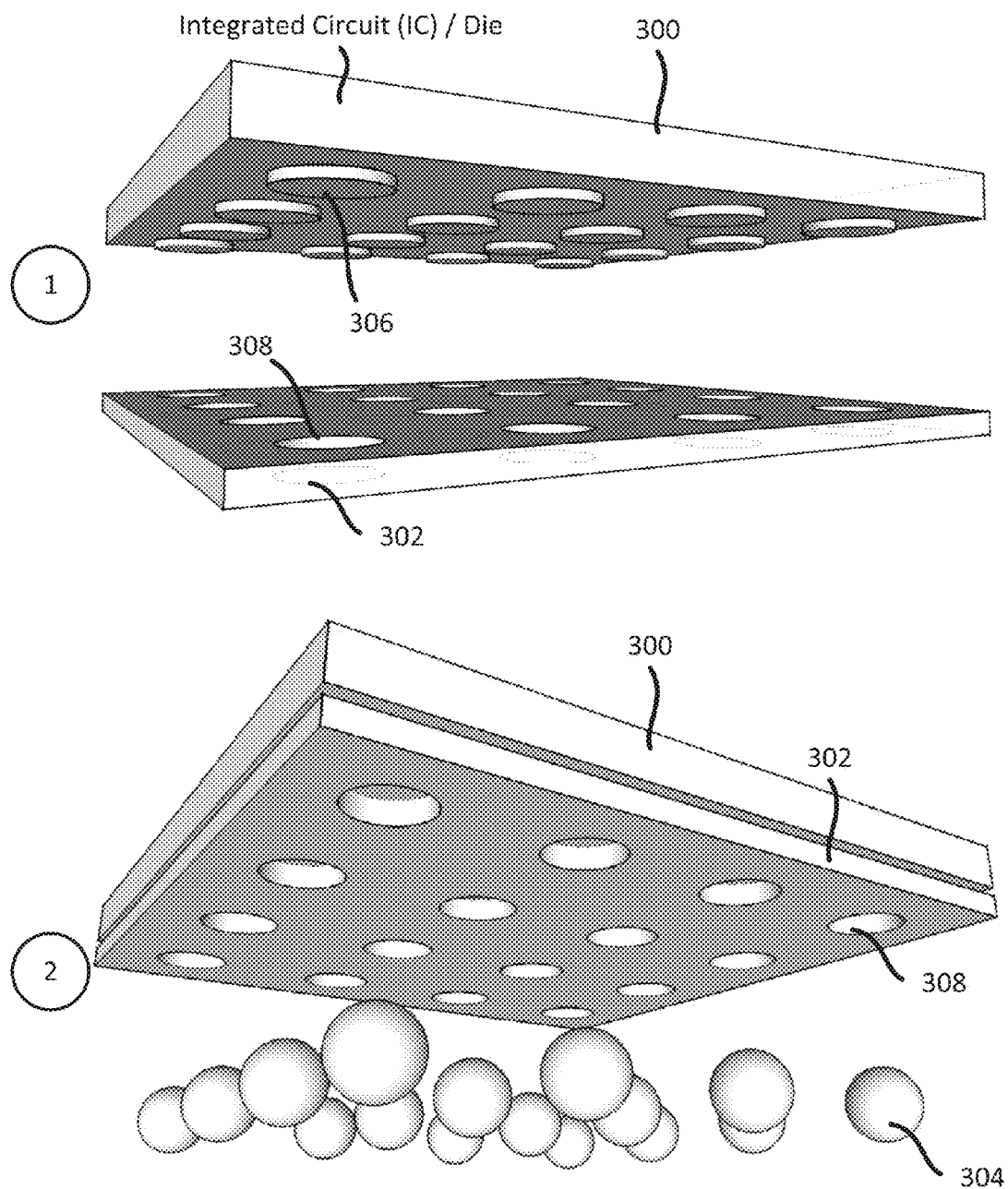
FIG. 3A illustrates an example of part of sequence for coupling a semiconductor device that includes an integrated passive device (IPD) to a die.
Figure 3B:
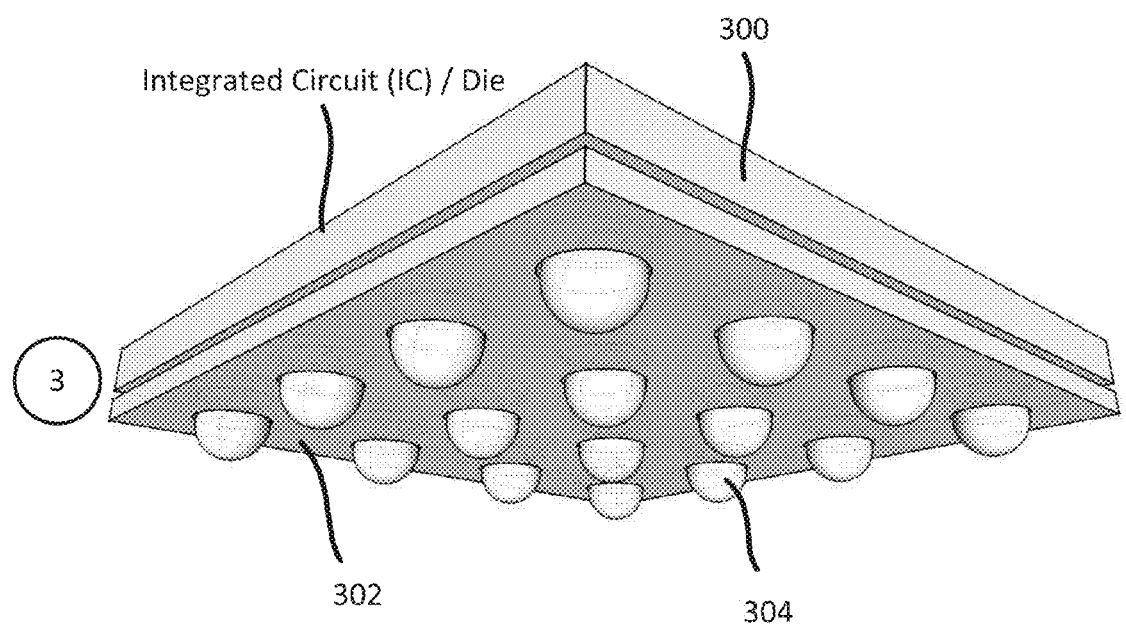
FIG. 3B illustrates an example of part of sequence for coupling a semiconductor device that includes an integrated passive device (IPD) to a die.

FIGS. 3A-3B illustrates a sequence for coupling a novel semiconductor device (e.g., wafer level package semiconductor device that includes one or more IPDs) to a die. As shown at stage 1 of FIG. 3A, a die 300 and a semiconductor device 302 are provided. In some implementations, the die 300 is a wafer level package (WLP) that is manufactured using a wafer level process. In some implementations, the semiconductor device 302 is a wafer level package (WLP) that is manufactured using a wafer level process. The die 300 includes several pads 306. In some implementations, each pad may include a ball pad, a first IPD pad and a second IPD pad. A more specific example of a pad that includes a ball pad, a first IPD pad and a second IPD pad is further described in FIG. 4B.

The semiconductor device 302 includes several cavities/holes 308. One or more cavities/holes 308 are configured to be occupied by solder balls (e.g., set of solder balls, set of interconnect materials). The semiconductor device 302 also includes one or more IPDs (e.g., capacitors, inductors), which is not visible. At stage 1, the semiconductor device 302 may be coupled to the die 300.

At stage 2, solder balls 304 (e.g., interconnect material) are provided and coupled to the die 300 through the cavities/holes 308 of the semiconductor device 302. In some implementations, the solder balls 304 may be coupled to the die 300 before the semiconductor device 302 is coupled to the die 300.

Stage 3 of FIG. 3B illustrates the end result of the coupling of the die 300 to the semiconductor device 302 and the solder ball 304. As shown in stage 3, the solder balls 304 are located in the cavities/holes 308 of the semiconductor device 302. The solder balls 304 are coupled to the die 300. The semiconductor device 302 is coupled to the die 300 as well. It should be noted that in some implementations, some of the cavities/holes 308 in the semiconductor device 302 may be empty. That is, in some implementations, some of the cavities/holes 308 of the semiconductor device 302 may not be occupied with an interconnect material (e.g., solder ball). In some implementations, the combination of the die 300 and the solder balls 304 (e.g., interconnect material) is a wafer level package (WLP) that is manufactured using a wafer level process. In some implementations, the combination of the die 300, the semiconductor device 302, and the solder balls 304 (e.g., interconnect material) is a wafer level package (WLP) that is manufactured using a wafer level process.

Figure 4A:
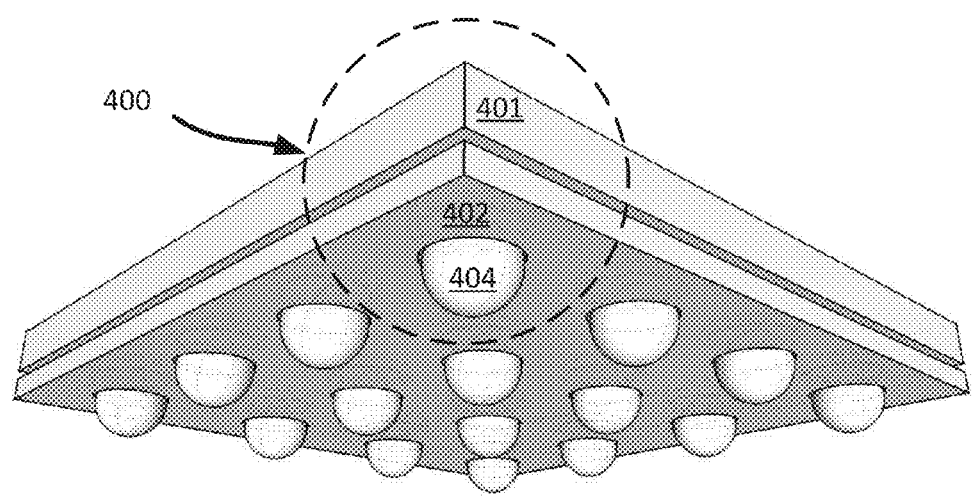
FIG. 4A illustrates an example of an angled view of a semiconductor device that includes an integrated passive device (IPD).
Figure 4B:
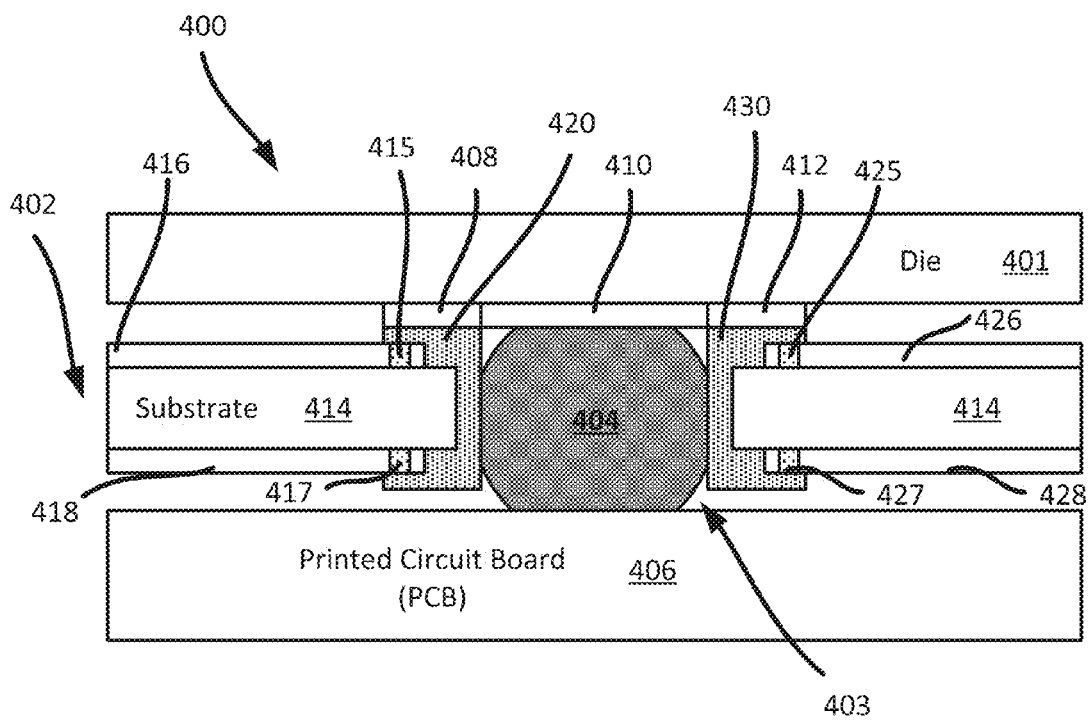
FIG. 4B illustrates an example of a side view of a semiconductor device that includes an integrated passive device (IPD).

FIGS. 4A-4B conceptually illustrate how a die (e.g., a wafer level package) may be coupled to a novel semiconductor device in some implementations. Specifically, FIG. 4 illustrates an angled view of an integrated circuit (IC)/die 401 that is coupled to a semiconductor device 402. In some implementations, the die 401 is a wafer level package (WLP) semiconductor device (e.g., semiconductor device manufactured using a wafer level process). In some implementations, the semiconductor device 402 is a wafer level package (WLP) semiconductor device (e.g., semiconductor device manufactured using a wafer level process). In some implementations, the semiconductor device 402 is an integrated passive device structure that includes one or more integrated passive devices (IPDs). The semiconductor device 402 includes several cavities/holes. One or more of these cavities/holes are occupied with interconnect material (e.g., solder balls 404). In some implementations, one or more of these cavities may be empty (that is at one or more of these cavities may be not be occupied with an interconnect material (e.g., solder ball)). In some implementations, an interconnect material (e.g., solder ball) is a material configured to couple a first device (e.g., die, chip) to a second device (e.g., printed circuit board, interposer). In some implementations, the first and/or second device is a semiconductor device. In some implementations, the combination of the die 401 and the solder balls 404 (e.g., interconnect material) is a wafer level package (WLP) that is manufactured using a wafer level process. In some implementations, the combination of the die 401, the semiconductor device 402, and the solder balls 404 (e.g., interconnect material) is a wafer level package (WLP) that is manufactured using a wafer level process.

The semiconductor device 402 includes a glass substrate in some implementations. However, the substrate can be other materials in some implementations. The semiconductor device 402 includes several integrated passive devices (IPDs), which are not visible in FIG. 4A. Examples of IPDs include capacitors, inductors, and resistors.

FIG. 4B illustrates profile/side view of a portion 400 of the die 401 and the semiconductor device 402 of FIG. 4A. FIG. 4B also illustrates a portion of a printed circuit board (PCB) 406. As shown in FIG. 4B, the die 401 is coupled to the semiconductor device 402 and the solder ball 404. The solder ball 404 is coupled to the PCB 406. The solder ball 404 is located in a cavity/hole 403 of the semiconductor device 402. The cavity/hole 403 may have different shapes and size in some implementations. The die 401 includes a pad. The pad includes a first integrated passive device (IPD) pad 408, a ball pad 410 and a second integrated passive device (IPD) pad 412. As shown in FIG. 4B, the first IPD pad 408, the ball pad 410 and the second IPD pad 412 are coupled to a first surface of the die 401.

The semiconductor device 402 includes a substrate 414, a first integrated passive device (IPD) 415, a first dielectric layer 416, a second integrated passive device (IPD) 417, a second dielectric layer 418 and a first metal layer 420. The substrate 414 is a glass substrate in some implementations. The first IPD 415 and the first dielectric layer 416 are on a first surface (e.g., top surface) of the substrate 414. Thus, as shown in FIG. 4B, in some implementations, the first IPD 415 is integrated/positioned on a surface of the semiconductor device 402 (e.g., top surface of the substrate of the semiconductor device). The second IPD 417 and the second dielectric layer 418 are on a second surface (e.g., bottom surface) of the substrate 414. Thus, as shown in FIG. 4B, in some implementations, the second IPD 417 is integrated/positioned on a surface of the semiconductor device 402 (e.g., bottom surface of the substrate of the semiconductor device). The first and second IPDs 415 and 417 may be at least one of a capacitor, inductor and/or resistor. It should be noted that FIG. 4B illustrates conceptual representations of IPDs. Specific illustrations and examples of IPDs are further illustrated and described in FIGS. 5-6.

The first metal layer 420 is on the side wall of the cavity/hole 403 in the substrate 414. The first metal layer 420 may be a copper plated layer. The first metal layer 420 may be electrically coupled to the first IPD 415 and/or the second IPD 417. The first metal layer 420 of the semiconductor device 402 is coupled to the first IPD pad 408 of the die 401. The solder ball 404 is coupled to the ball pad 410 of the die 401.

FIG. 4B also illustrates that the semiconductor device 402 includes a third integrated passive device (IPD) 425, a third dielectric layer 426, a third integrated passive device (IPD) 427, a fourth dielectric layer 428 and a second metal layer 430. In some implementations, the third dielectric layer 426 is the same as the first dielectric layer 416. In some implementations, the fourth dielectric layer 428 is the same as the second dielectric layer 418. The third IPD 425 and the third dielectric layer 426 are on the first surface (e.g., top surface) of the substrate 414. The fourth IPD 427 and the fourth dielectric layer 428 are on the second surface (e.g., bottom surface) of the substrate 414. The third and fourth IPDs 425 and 427 may be at least one of a capacitor, inductor and/or resistor.

The second metal layer 430 is on the side wall of the cavity/hole 403 in the substrate 414. The second metal layer 430 may be a copper plated layer. The metal layer 430 may be electrically coupled to the third IPD 425 and/or the fourth IPD 427. The second metal layer 430 of the semiconductor device 402 is coupled to the second IPD pad 412 of the die 401.

In some implementations the first metal layer 420 is the same metal layer as the second metal layer 430. FIG. 4 illustrates the solder ball 404 (e.g., interconnect material) is directly coupled to (e.g., in direct contact with) the first metal layer 420 and the second metal layer 430. However, in some implementations, the solder ball 404 may not be directly coupled to (e.g., may not be in direct contact) with the first metal layer 420 and/or the second metal layer 430.

In some implementations, the die 401 is part of a first wafer, and the semiconductor device 402 is part of a second wafer. In some implementations, the first wafer that includes several dies (e.g., die 401) is coupled to a second wafer that includes several semiconductor devices (e.g., semiconductor device 402). In some implementations, the first and second wafers are sliced/diced together to produce a die (e.g., die 401) that is coupled to a semiconductor device (e.g., semiconductor device 402). In some implementations, the first and second wafers are sliced/diced together after a set of solder balls (e.g. solder balls 404) is coupled to the first wafer to produce a die (e.g., die 401) that is coupled to a semiconductor device (e.g., semiconductor device 402) and solder balls. In some implementations, the set of solder balls may be coupled to the first wafer before or after coupling the second wafer to the first wafer.

Exemplary Semiconductor Device that Includes Integrated Passive Device (IPD)

Figure 5:
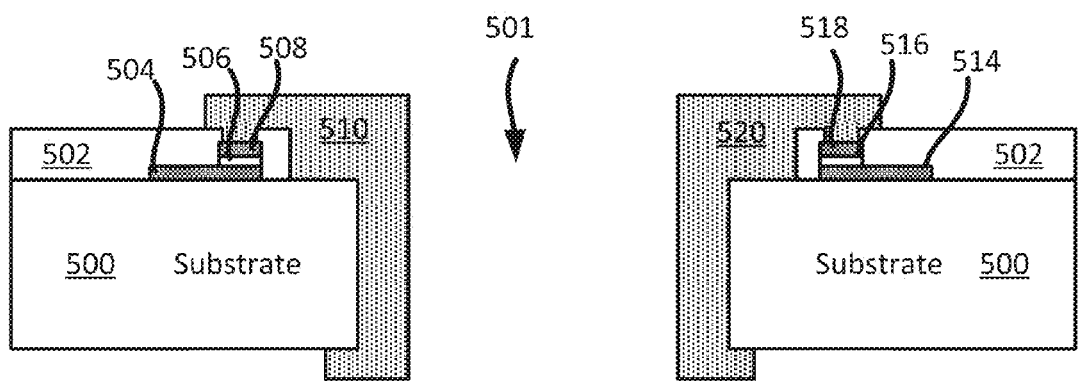
FIG. 5 illustrates an example of a side view of a semiconductor device that includes an integrated passive device (IPD).
Figure 6:
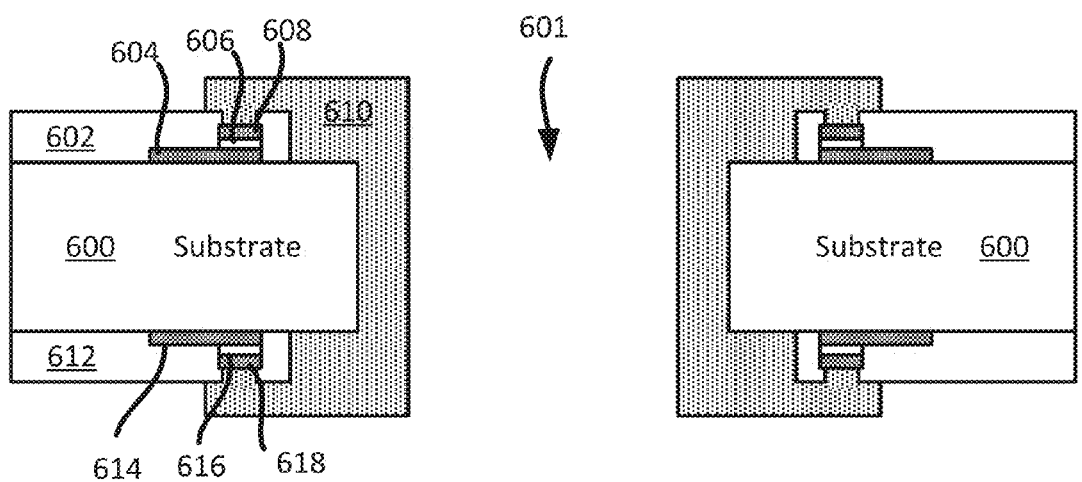
FIG. 6 illustrates an example of a side view of a semiconductor device that includes an integrated passive device (IPD).

FIGS. 5-6 illustrate detailed side views of a semiconductor device. Specifically, FIGS. 5-6 illustrate side views of a semiconductor device with integrated passive device (IPD) shown in detail. In some implementations, the semiconductor devices of FIGS. 5-6 are wafer level package (WLP) semiconductor devices (e.g., semiconductor device manufactured using a wafer level process). In some implementations, the semiconductor device of FIGS. 5-6 is an integrated passive device structure that includes one or more integrated passive devices (IPDs).

As shown in FIG. 5, a semiconductor device includes a substrate 500, a cavity/hole 501, an inter dielectric layer 502 and a first integrated passive device (IPD). The first IPD (e.g., first means for integrated passive functionality) includes a first IPD metal layer 504, a first IPD dielectric layer 506, and a second IPD metal layer 508. The first IPD metal layer 504 is located on a first surface of the substrate 500. The first IPD dielectric layer 506 is located on a portion of the first IPD metal layer 504. The second IPD metal layer 508 is located on at least the first IPD dielectric layer 506. As further shown in FIG. 5, the first IPD dielectric layer 506 is located between the first IPD metal layer 504 and the second IPD metal layer 508. In some implementations, the area of the second IPD metal layer 508 overlaps with the area of the first IPD dielectric layer 506. In some implementations, the first IPD dielectric layer 506 is part of the inter dielectric layer 502. The first IPD is a capacitor (e.g., decoupling capacitor) in some implementations. The first IPD is on a first surface (e.g., top surface) of the semiconductor device. Thus, as shown in FIG. 5, in some implementations, the first IPD is integrated/positioned on a surface of the semiconductor device (e.g., top surface of the substrate of the semiconductor device).

The semiconductor device also includes a first metal layer 510. The first metal layer 510 is a copper plated layer in some implementations. The first metal layer 510 is located on the side wall of the cavity/hole 501. In some implementations, the first metal layer 510 is a first side metal layer. The cavity/hole 501 is configured to be occupied by an interconnect material (e.g., solder ball). The first metal layer 510 is electrically coupled to the first IPD (e.g., to the second IPD metal layer 508). The first metal layer 510 is configured to be coupled to a pad on a die (e.g., IPD pad 408) in some implementations. As shown in FIG. 5, the first metal layer 510 is coupled to a portion of a first surface (e.g., top surface) of the substrate 500, a side portion of the substrate 500, and a portion of a second surface (e.g., bottom surface) of the substrate 500. In some implementations, the first metal layer 510 may be a through substrate via (TSV) or a through glass via (TGV).

FIG. 5 also illustrates that the semiconductor device includes another integrated passive device (IPD) (e.g. second IPD). The second IPD (e.g., second means for integrated passive functionality) includes a third IPD metal layer 514, a second IPD dielectric layer 516, and a fourth IPD metal layer 518. The third IPD metal layer 514 is located on the first surface of the substrate 500. The second IPD dielectric layer 516 is located on a portion of the third IPD metal layer 514. The fourth IPD metal layer 518 is located on at least the second IPD dielectric layer 516. As shown in FIG. 5, the second IPD dielectric layer 516 is located between the third IPD metal layer 514 and the fourth IPD metal layer 518. In some implementations, the area of the fourth IPD metal layer 518 overlaps with the area of the second IPD dielectric layer 516. In some implementations, the second IPD dielectric layer 516 is part of the inter dielectric layer 502. The second IPD is a capacitor (e.g., decoupling capacitor) in some implementations. The second IPD is on a first surface (e.g., top surface) of the semiconductor device.

The semiconductor device also includes a second metal layer 520. The second metal layer 520 is a copper plated layer in some implementations. The second metal layer 520 is located on the side wall of the cavity/hole 501. In some implementations, the second metal layer 520 is a second side metal layer. In some implementations, the second metal layer 520 is the same as the first metal layer 510. The second metal layer 520 is electrically coupled to the IPD (e.g., to the second metal layer 508). The second metal layer 520 is configured to be coupled to a pad on a die (e.g., IPD pad 412) in some implementations. As shown in FIG. 5, the second metal layer 520 is coupled to a portion of a first surface (e.g., top surface) of the substrate 500, a side portion of the substrate 500, and a portion of a second surface (e.g., bottom surface) of the substrate 500. In some implementations, the second metal layer 520 may be a through substrate via (TSV) or a through glass via (TGV).

FIG. 6 illustrates another semiconductor device that includes a substrate 600, a cavity/hole 601, a first inter dielectric layer 602 and a first integrated passive device (IPD). The first IPD (e.g., first means for integrated passive functionality) includes the first IPD metal layer 604, the first IPD dielectric layer 606, and the second IPD metal layer 608. The first IPD is a capacitor (e.g., decoupling capacitor) in some implementations. The first IPD is on the first surface (e.g., top surface) of the semiconductor device. The semiconductor device also includes a first metal layer 610. The first metal layer 610 is a copper plated layer in some implementations. In some implementations, the first metal layer 610 may be a through substrate via (TSV) or a through glass via (TGV). The first metal layer 610 is located on the side wall of the cavity/hole 601. In some implementations, the first metal layer 610 is a first side metal layer. The cavity/hole 601 is configured to be occupied by an interconnect material (e.g., solder ball). The first metal layer 610 is electrically coupled to the first IPD (e.g., to the second IPD metal layer 608). In some implementations, the first IPD, which includes the first IPD metal layer 604, the first IPD dielectric layer 606, and the second IPD metal layer 608, is a representation of the first IPD 415 of FIG. 4B. Thus, as shown in FIG. 6, in some implementations, the first IPD is integrated on a surface of the semiconductor device (e.g., top surface of the substrate of the semiconductor device).

FIG. 6 also illustrates that the semiconductor device also includes a second inter dielectric layer 612 and a second integrated passive device (IPD). The second IPD (e.g., second means for integrated passive functionality) includes a third IPD metal layer 614, a second IPD dielectric 616, and a fourth IPD metal layer 618. The second IPD is a capacitor (e.g., decoupling capacitor) in some implementations. The second IPD is on a second surface (e.g., bottom surface) of the semiconductor device. The semiconductor device also includes a first metal layer 610. The first metal layer 610 is a copper plated layer in some implementations. The first metal layer 610 is located on the side wall of the cavity/hole 601. The cavity/hole 601 is configured to be occupied by an interconnect material (e.g., solder ball). The first metal layer 610 may be electrically coupled to the first IPD and/or second IPD (e.g., to the second IPD metal layer 608, and/or to the fourth IPD metal layer 618). The first metal layer is 610 is configured to be coupled to a pad on a die. In some implementations, the second IPD, which includes the third IPD metal layer 614, the second IPD dielectric layer 616, and the fourth IPD metal layer 618, is a representation of the second IPD 417 of FIG. 4B. Thus, as further shown in FIG. 6, in some implementations, the second IPD is integrated/positioned on a surface of the semiconductor device (e.g., bottom surface of the substrate of the semiconductor device).

It should be noted that the substrate 500 of FIG. 5 and the substrate 600 of FIG. 6 may be substrates of wafer in some implementations. As such, FIG. 5 and FIG. 6 may represent semiconductor devices on a wafer before the slicing/dicing of the wafer in some implementations. In some implementations, the semiconductor device of FIG. 5 and FIG. 6 are semiconductor devices after the slicing/dicing of a wafer that includes several semiconductor devices. Having described various implementations and/or embodiments of a semiconductor device that includes one or more integrated passive device (IPD) on a surface of a substrate of the semiconductor, a sequence for providing/manufacturing one or more a semiconductor device that includes one or more integrated passive device (IPD).

Exemplary Sequence for Providing/Manufacturing a Semiconductor Device that Includes an Integrated Passive Device (IPD)

FIGS. 7A-7D illustrate an exemplary sequence for providing a semiconductor device that includes an integrated passive device (IPD). In some implementations, the sequence of FIGS. 7A-7D may be used to provide/manufacture the semiconductor device of FIGS. 2, 3A-3B, 4A-4B, and/or 5-6 or other semiconductor device described in the present disclosure. In some implementations, the semiconductor device is a wafer level package (WLP) semiconductor device (e.g., semiconductor device manufactured using a wafer level process). In some implementations, the semiconductor device is an integrated passive device structure that includes one or more integrated passive devices (IPDs). In some implementations, the sequence of FIGS. 7A-7D illustrate an example of providing a wafer that includes several semiconductor devices (e.g., providing an uncut semiconductor device on a wafer).

Figure 7A:
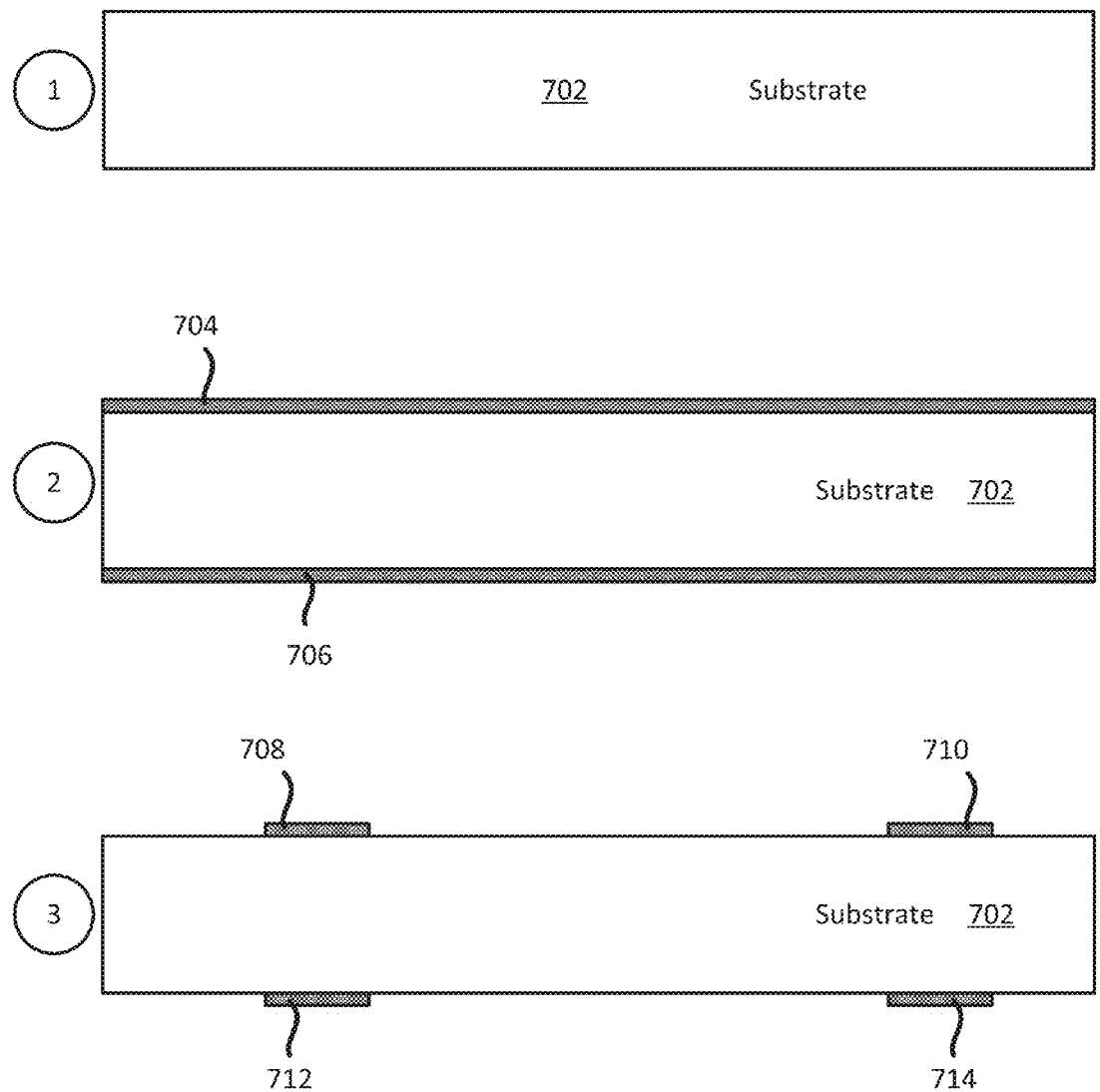
FIG. 7A illustrates part of an exemplary sequence for providing/manufacturing a semiconductor device that includes an integrated passive device (IPD).

As shown in stage 1 of FIG. 7A, a substrate (e.g., substrate 702) is provided. In some implementations, the substrate is a wafer. Different implementations may use different materials for the substrate (e.g., silicon substrate, glass substrate).

At stage 2, a first metal layer 704 and a second metal layer 706 is provided. Specifically, the first metal layer 704 is provided on a first surface (e.g., top surface) of the substrate 702 and the second metal layer 706 is provided on a second surface (e.g., bottom surface) of the substrate 702. In some implementations, the first and second metal layers 704-706 are copper layers. Different implementations may provide the first and second metal layers 704-706 differently. In some implementations, the substrate 702 may be provided from a supplier with the first and second metal layers 704-706. Thus, in some implementations, stage 1 and stage 2 may be part of the same stage in some implementations.

At stage 3, the first and second metal layers 704-706 are selectively etched to define components of one or more integrated passive device. As shown in stage 3, the first metal layer 704 is selectively etched, leaving a first IPD metal layer 708 and a second IPD metal layer 710. Similarly, at stage 3, the second metal layer 706 is selectively etched, leaving a third IPD metal layer 712 and a fourth IPD metal layer 714.

Figure 7B:
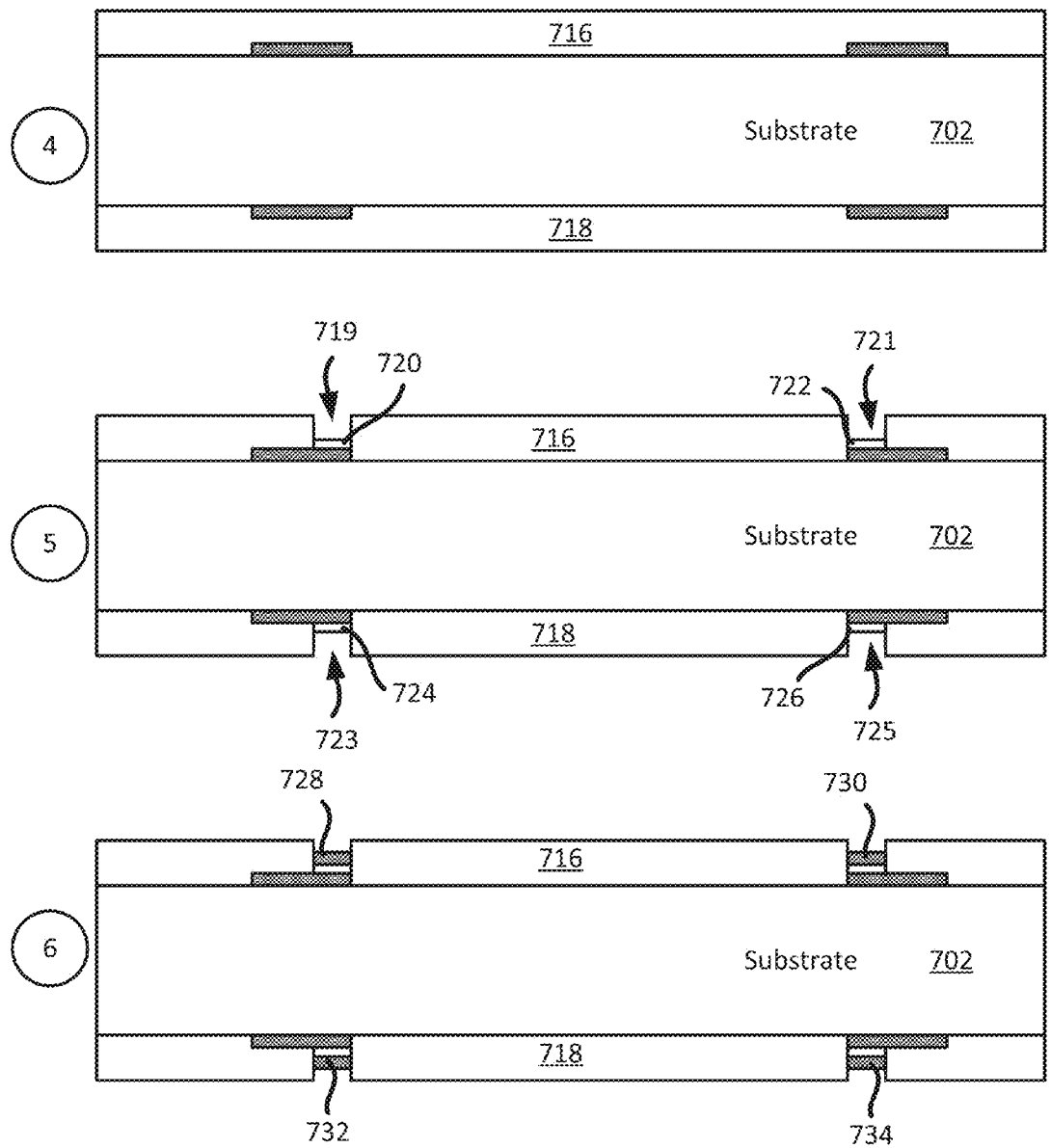
FIG. 7B illustrates part of an exemplary sequence for providing/manufacturing a semiconductor device that includes an integrated passive device (IPD).

At stage 4 of FIG. 7B, a first dielectric layer 716 is provided on the first surface (e.g., top surface) of the substrate 702. The first dielectric layer 716 also covers the first and second IPD metal layers 708-710. Stage 4 also illustrates a second dielectric layer 718 being provided on the second surface (e.g., bottom surface) of the substrate 702. The second dielectric layer 718 also covers the third and fourth IPD metal layers 712-714.

At stage 5, several trenches (e.g., trenches 719, 721, 723, 725) are provided in the first and second dielectric layers 716-718. These trenches are vertically defined over a portion of one or more of the IPD metal layers 708-714. In some implementations, the trench traverses part of the dielectric layer (e.g., part of the first and/or second dielectric layers 716-718), leaving some dielectric over the IPD metal layers 708-714. The dielectric that is left behind is an IPD dielectric layer that is part of an IPD in some implementations. As shown in stage 5, a first IPD dielectric layer 720 remains on the first IPD metal layer 708. Similarly, a second IPD dielectric layer 722 remains on the second IPD metal layer 710, a third IPD dielectric layer 724 remains on the third IPD metal layer 712, and a fourth IPD dielectric layer 726 remains on the fourth IPD metal layer 714. In some implementations, the trenches (e.g., trenches 719, 721, 723, 725) may traverse up to the IPD metal layers (e.g., IPD metal layers 708-714) and one or more dielectrics may be provided (e.g., partially filled) in the trench to define the first, second, third, and fourth IPD dielectric layers (e.g., IPD dielectric layers 720, 722, 724, 726).

At stage 6, several IPD metal layers may be provided in the trenches. As shown in stage 6, a fifth IPD metal layer 728 is provided (e.g., partially filled) in the trench 719, a sixth IPD metal layer 730 is provided (e.g., partially filled) in the trench 721, a seventh IPD metal layer 732 is provided (e.g., partially filled) in the trench 723, and an eighth IPD metal layer 734 is provided (e.g., partially filled) in the trench 725. The fifth IPD metal layer 728 is provided on the first IPD dielectric layer 720. The sixth IPD metal layer 730 is provided on the second IPD dielectric layer 722. The seventh IPD metal layer 732 is provided on the third IPD dielectric layer 724. The eighth IPD metal layer 734 is provided on the fourth IPD dielectric layer 726.

In some implementations, a first IPD on the substrate 702 of a semiconductor device is defined by the first IPD metal layer 708, the first IPD dielectric layer 720, and the fifth IPD metal layer 728. In some implementations, a second IPD on the substrate 702 of a semiconductor device is defined by the second IPD metal layer 7010, the second IPD dielectric layer 722, and the sixth IPD metal layer 730. In some implementations, a third IPD on the substrate 702 of a semiconductor device is defined by the third IPD metal layer 712, the third IPD dielectric layer 724, and the seventh IPD metal layer 732. In some implementations, a fourth IPD on the substrate 702 of a semiconductor device is defined by the fourth IPD metal layer 714, the fourth IPD dielectric layer 726, and the eighth IPD metal layer 734.

Figure 7C:
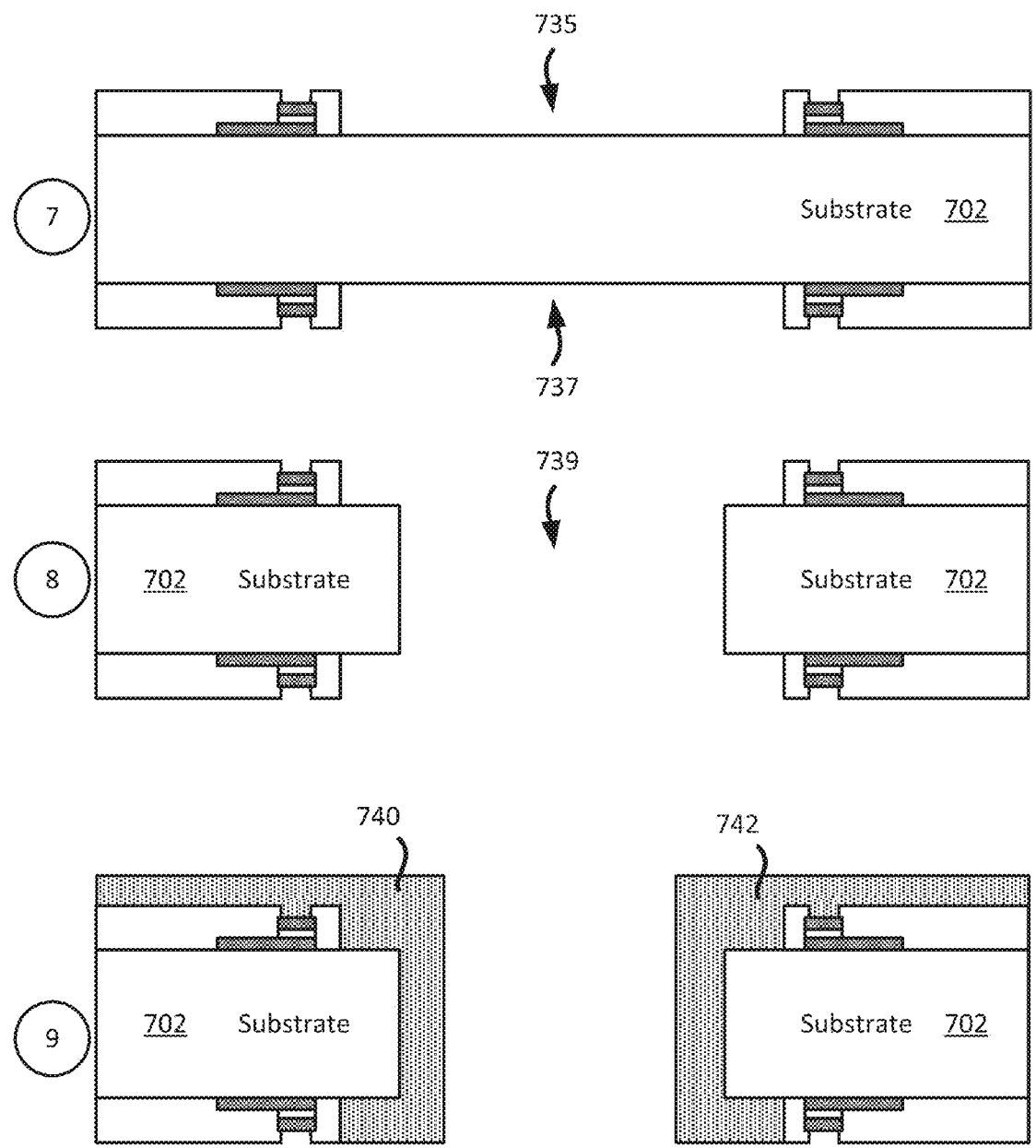
FIG. 7C illustrates part of an exemplary sequence for providing/manufacturing a semiconductor device that includes an integrated passive device (IPD).

At stage 7 of FIG. 7C, portions of the first and second dielectric layers 716-718 are selectively etched, creating a first trench 735 in the first dielectric layer 716 and a second trench 737 in the second dielectric layer 718. Different implementations may user different processes to selectively etch the first and second dielectric layers 716-718.

At stage 8, a cavity/hole 739 is provided in the substrate 702. In some implementations, the cavity/hole 739 is configured to be occupied by an interconnect material (e.g., solder ball). Different implementations may use different shapes and sizes for the cavity/hole 739. In some implementations, a laser may be used to provide/create the cavity/hole 739 in the substrate 702.

At stage 9, a first metal layer 740 and a second metal layer 742 are provided on a surface (e.g., side wall of cavity and top surface) of the substrate 702. In some implementations, the first and second metal layers 740-742 is plated copper. However, different implementations may user different metals.

Figure 7D:
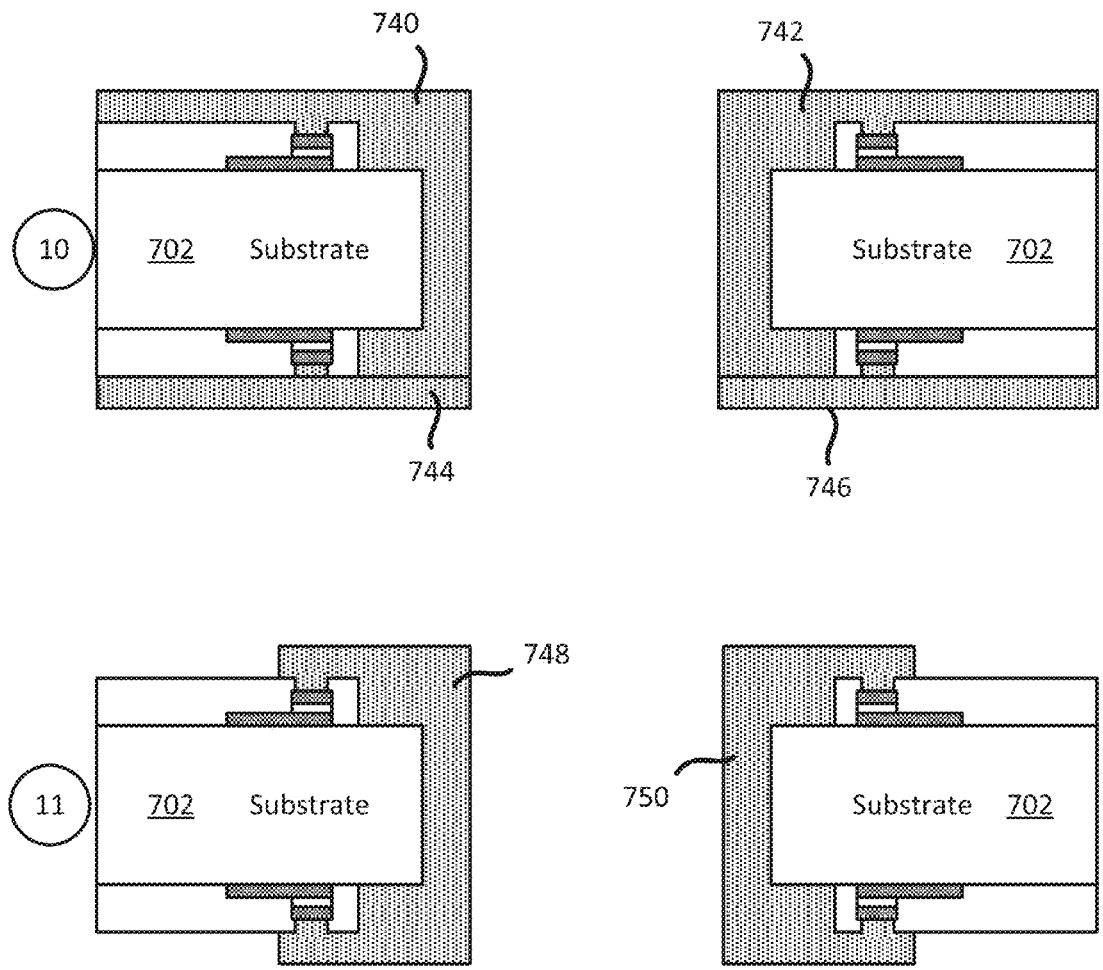
FIG. 7D illustrates part of an exemplary sequence for providing/manufacturing a semiconductor device that includes an integrated passive device (IPD).

At stage 10 of FIG. 7D, a third metal layer 744 and a fourth metal layer 746 are provided on a surface (e.g., bottom surface) of the substrate 702. In some implementations, the At stage 11, portions of the first and second metal layers 740-742, and portions of the third and fourth metal layers 744-746 are etched, leaving a first metal layer 748 and a second metal layer 750. The first metal layer 748 may electrically couple a first IPD to a third IPD. The second metal layer 750 may electrically couple a second IPD to a fourth IPD.

Having described an example of a sequence for providing a semiconductor device that includes an integrated passive device (IPD), an example of a method for providing a semiconductor device that includes an integrated passive device (IPD).

Exemplary Method for Providing/Manufacturing a Semiconductor Device that Includes an Integrated Passive Device (IPD)

Figure 8:
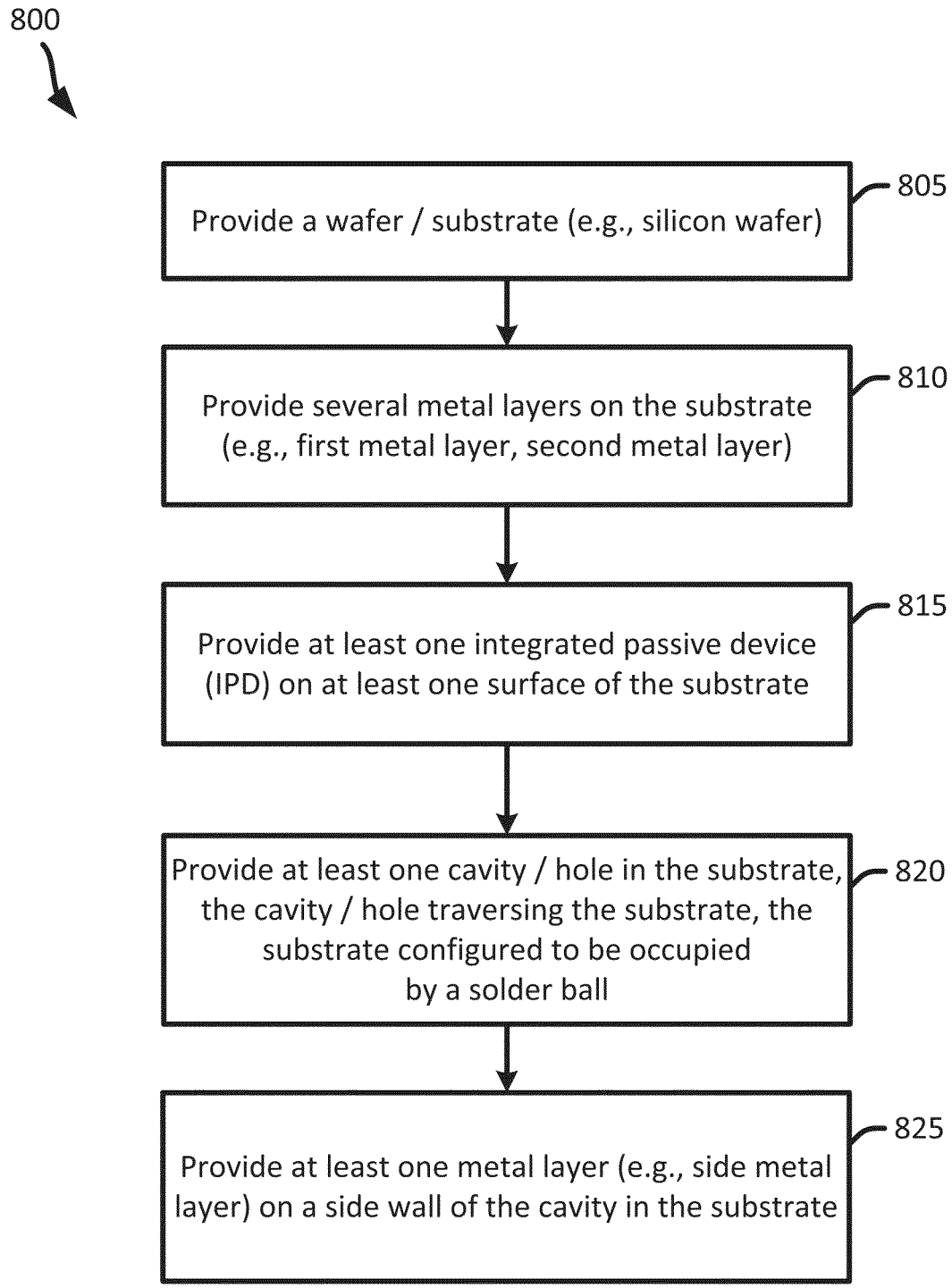
FIG. 8 illustrates an exemplary method for providing/manufacturing a semiconductor device that includes an integrated passive device (IPD) to a die.

FIG. 8 illustrates an exemplary method for providing a semiconductor device that includes an integrated passive device (IPD). In some implementations, the method of FIG. 8 may be used to provide/manufacture the semiconductor device of FIGS. 2, 3A-3B, 4A-4B, and/or 5-6 or other semiconductor device described in the present disclosure. In some implementations, the semiconductor device is a wafer level package (WLP) semiconductor device (e.g., semiconductor device manufactured using a wafer level process). In some implementations, the semiconductor device is an integrated passive device structure that includes one or more integrated passive devices (IPDs). In some implementations, the method of FIG. 8 illustrates an example of providing a wafer that includes several semiconductor devices (e.g., providing an uncut semiconductor device on a wafer).

The method provides (at 805) a substrate (e.g., substrate 702). In some implementations, the substrate is a wafer. Different implementations may use different materials for the substrate (e.g., silicon substrate, glass substrate).

The method then provides (at 810) several metal layers on the substrate. For example, the method may provide a first metal layer (e.g., first metal layer 704) on a first surface (e.g., top surface) of the substrate and a second metal layer (e.g., second metal layer 706) on a second surface (e.g., bottom surface) of the substrate. In some implementations, the first and second metal layers are copper layers. Different implementations may provide the first and second metal layers 704-706 differently. In some implementations, the substrate may be provided from a supplier with the first and second metal layers. Thus, in some implementations, providing (at 810) the metal layers on the substrate may be bypassed in some implementations.

The method provides (at 815) at least one integrated passive device (IPD) on the substrate. Examples of an IPD may include capacitor, inductor, and/or resistor. Different implementations may use different processes for providing (at 815) at least one IPD on the substrate. In some implementations, providing the at least one IPD includes defining at least one IPD on one or more surfaces of the substrate of the semiconductor device.

Different implementations may provide the IPD differently. For example, in some implementations, providing (at 815) an IPD includes selectively etching first and second metal layers, providing first and second dielectric layers on one or more surfaces of the substrate, providing several trenches in the first and second dielectric layers, and providing several metal layers in the trenches. An example of providing (at 815) one or more IPD on a substrate is shown and described in at least stage 3 through stage 6 of FIGS. 7A-7C.

The method further provides (at 820) at least one cavity/hole in the substrate. The cavity/hole traverses the substrate. The cavity/hole is configured to be occupied by an interconnect material (e.g., solder ball) in some implementations. In some implementations, providing (at 820) the at least one cavity/hole may also include selectively etching portions of the first and second dielectric layers.

The method also provides (at 825) at least one metal layer (e.g., side metal layer) on the side wall of the cavity in the substrate. In some implementations, the metal layer may electrically couple a first integrated passive device to a second passive device on the substrate. The metal layer may be provided on the side wall of the cavity/hole in the substrate.

In some implementations, the semiconductor device that is provided (e.g., manufactured) is then coupled to a die (e.g., another wafer level package). In some implementations, solder balls are coupled to the die before the semiconductor device is coupled to the die. In some implementations, solder balls (e.g., interconnect materials) are provided (e.g., dropped) in one or more of the cavities once the semiconductor device is coupled to the die.

In some implementations, the semiconductor device is on a first wafer that includes several semiconductor devices. In some implementations, the first wafer that includes several semiconductor devices (e.g., semiconductor that includes integrated passive device) is coupled to a second wafer that includes several dies (e.g., integrated circuits). In some implementations, the first and second wafers are sliced/diced once the first and second wafers are coupled together. In some implementations, solder balls may be provided and/or coupled to the second wafer (e.g., wafer that includes the dies) through the cavities in the first wafer (e.g., wafer that includes the semiconductor device) before the first wafer and/or second wafer are diced/sliced.

Exemplary Circuit Diagrams Superimposed on a Semiconductor Device

Figure 9:
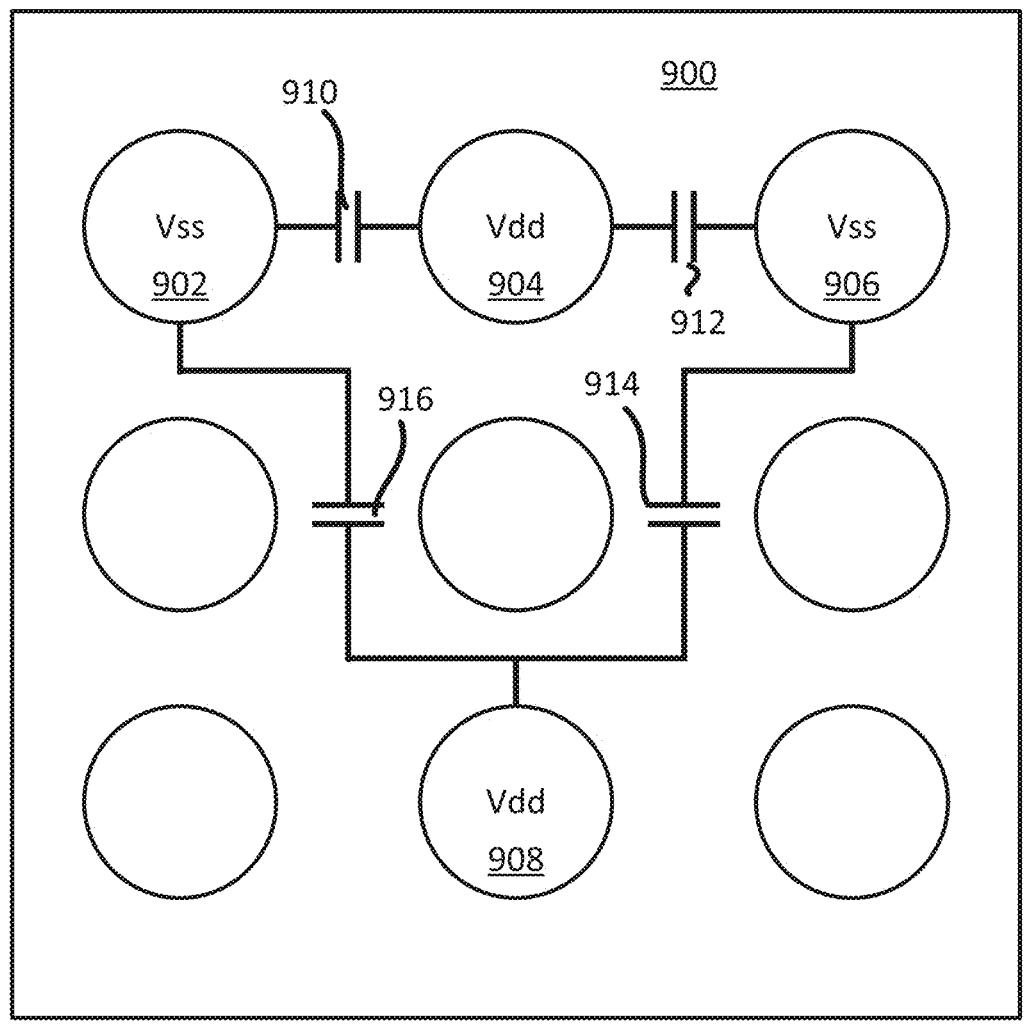
FIG. 9 illustrates an exemplary circuit diagram superimposed on a conceptual illustration of a semiconductor device that includes integrated passive devices (IPDs).

FIG. 9 illustrates an exemplary circuit diagram superimposed on a conceptual illustration of an semiconductor device that includes integrated passive devices (IPDs). As shown in FIG. 9, the circuit diagram includes a first node 902, a second node 904, a third node 906 and a fourth node 908. The first node 902 includes a first interconnect material (e.g., first solder ball), the second node 904 includes a second interconnect material (e.g., second solder ball), the third node 906 includes a third interconnect material (e.g., third solder ball), and the fourth node 908 includes a fourth interconnect material (e.g., fourth solder ball). The circuit diagram also includes a first IPD 910, a second IPD 912, a third IPD 914 and a fourth IPD 916. The first, second, third and fourth IPDs 910-916 are capacitors (e.g., decoupling capacitors). The first, second, third and fourth IPDs 910-916 are integrated in the semiconductor device 900 in some implementations. Different implementations may use different configurations of nodes and IPDs in the semiconductor device 900. It should be noted that in some implementations, the IPDs of FIG. 9 can be arranged in series and/or in parallel.

Figure 10:
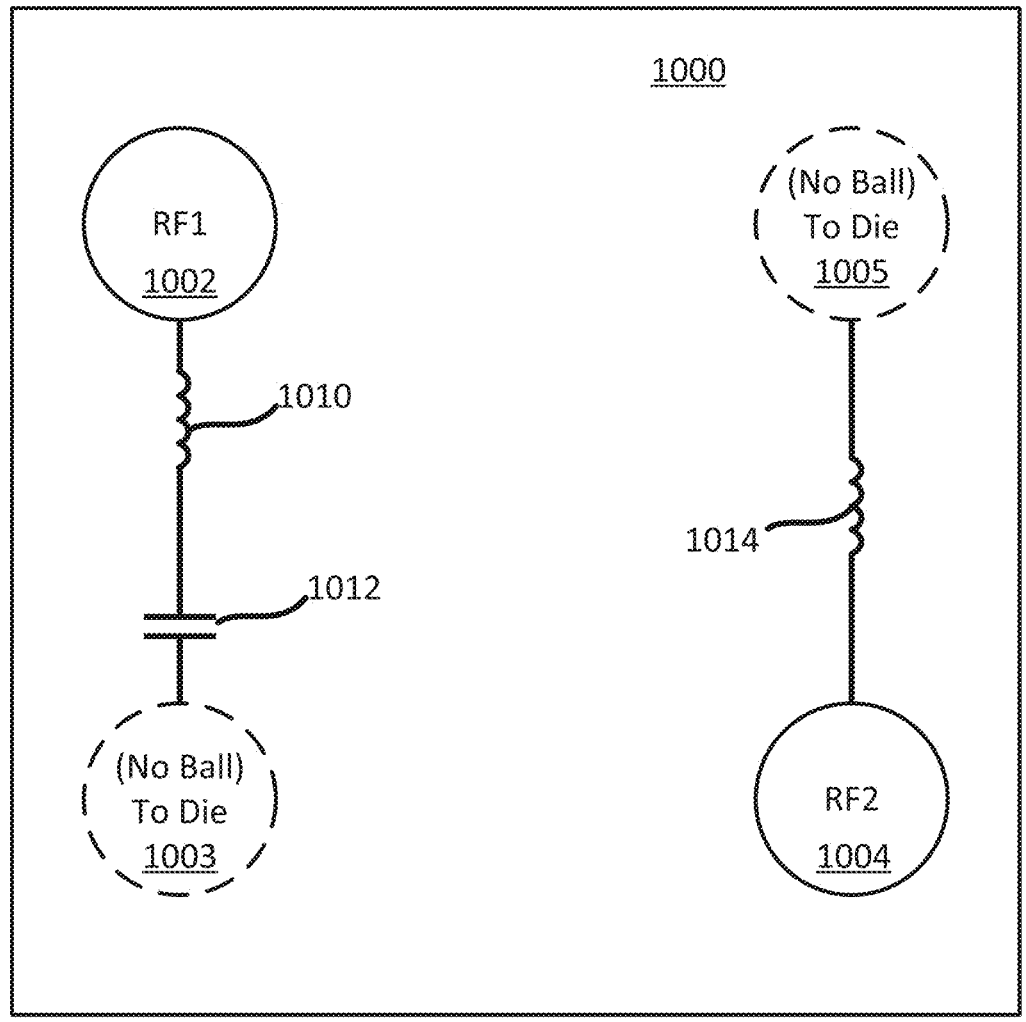
FIG. 10 illustrates another exemplary circuit diagram superimposed on a conceptual illustration of an semiconductor device that includes integrated passive devices (IPDs).

FIG. 10 illustrates another circuit diagram superimposed on a conceptual illustration of an semiconductor device that includes integrated passive devices (IPDs). As shown in FIG. 10, the circuit diagram includes a first node 1002, a second node 1003, a third node 1004 and a fourth node 1005. The first node 1002 includes a first interconnect material (e.g., first solder ball), and the second node 903 includes a portion of die that is coupled to the semiconductor device 1000. The third node 1004 includes a second interconnect material (e.g., second solder ball), and the fourth node 1005 includes a third interconnect material (e.g., third solder ball). The circuit diagram also includes a first IPD 1010, a second IPD 1012, and a third IPD 1014. The first IPD 1010 is a resistor, and the second IPD 1012 is a capacitor. The first and second IPDs 1010-1012 are located between the first and second nodes 1002-1003. The third IPD 1014 is a resistor and is located between the third and fourth nodes 1004-1005. The first, second, and third IPDs 1010-1014 are integrated in the semiconductor device 1000 in some implementations. Different implementations may use different configurations of nodes and IPDs in the semiconductor device 1000. It should be noted that in some implementations, the IPDs of FIG. 10 can be arranged in series and/or in parallel.

Exemplary Electronic Devices

Figure 11:
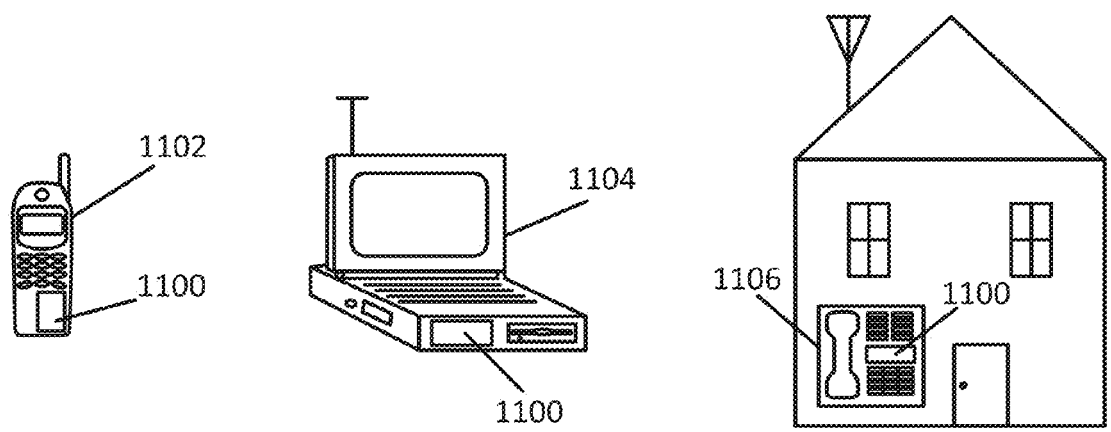
FIG. 11 illustrates various electronic devices that may integrate a semiconductor device, a die, an integrated circuit and/or PCB described herein.

FIG. 11 illustrates various electronic devices that may be integrated with any of the aforementioned semiconductor device, integrated circuit, die, interposer or package. For example, a mobile telephone 1102, a laptop computer 1104, and a fixed location terminal 1106 may include an integrated circuit (IC) 1100 as described herein. The IC 1100 may be, for example, any of the integrated circuits, dice or packages described herein. The devices 1102, 1104, 1106 illustrated in FIG. 11 are merely exemplary. Other electronic devices may also feature the IC 1100 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 2, 3A-3B, 4A-4B, 5, 6, 7, 8, 9, 10 and/or 11 may be rearranged and/or combined into a single component, step, feature or function or embodied in several components, steps, or functions. Additional elements, components, steps, and/or functions may also be added without departing from the invention.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A device comprising:
    a substrate;
    a first cavity traversing the substrate;
    a first metal layer coupled to a first side wall of the substrate and extending along a length of the first cavity;
    an interconnect, formed from a first solder ball formed within the first cavity and distinct from the first metal layer, that extends through the first cavity and is coupled to the first metal layer, the interconnect further directly coupled to a ball pad on an integrated circuit (IC) disposed at a first side of the substrate and to a printed circuit board disposed at a second side of the substrate opposite the first side of the substrate; and
    a first integrated passive device (IPD) on a first surface of the substrate, the first IPD distinct from and coupled to the first metal layer.

2. The device of claim 1, wherein the interconnect is formed from a single solder ball.

3. The device of claim 1, wherein the first IPD is one of at least a capacitor, an inductor and/or a resistor.

4. The device of claim 1, further comprising a second integrated passive device (IPD) on a second surface of the substrate, the second IPD coupled to the first metal layer.

5. The device of claim 1, further comprising:
    a second metal layer coupled to a second side wall of the substrate and extending along the length of the first cavity; and
    a second integrated passive device (IPD) on the first surface of the substrate, the second IPD coupled to the second metal layer.

6. The device of claim 5, wherein the first and second metal layers are the same.

7. The device of claim 1, wherein the device is a wafer level package (WLP) semiconductor device configured to be coupled to the IC, the IC including an IPD pad.

8. The device of claim 7, wherein the first metal layer extends through the first cavity and is directly coupled to the IPD pad of the IC.

9. The device of claim 1, wherein the first IPD is configured to be electrically coupled to the interconnect through the first metal layer and the device is configured to be coupled to the IC.

10. The device of claim 1, wherein the device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

11. An apparatus comprising:
    a substrate;
    a first cavity traversing the substrate;
    a first metal layer coupled to a first side wall of the substrate and extending along a length of the first cavity;
    an interconnect means, formed from a first solder ball formed within the first cavity and distinct from the first metal layer, that extends through the first cavity and is coupled to the first metal layer, the interconnect means further directly coupled to a ball pad on an integrated circuit (IC) disposed at a first side of the substrate and to a printed circuit board disposed at a second side of the substrate opposite the first side of the substrate; and
    a first means for integrated passive functionality on a first surface of the substrate, the first means distinct from and coupled to the first metal layer.

12. The apparatus of claim 11, wherein the interconnect means is formed from a single solder ball.

13. The apparatus of claim 11, wherein the first means for integrated passive functionality is one of at least a capacitor, an inductor and/or a resistor.

14. The apparatus of claim 11, further comprising a second means for integrated passive functionality on a second surface of the substrate, the second means for integrated passive functionality coupled to the first metal layer.

15. The apparatus of claim 11, further comprising:
    a second metal layer coupled to a second side wall of the substrate and extending along the length of the first cavity; and a second means for integrated passive functionality on the first surface of the substrate, the second means for integrated passive functionality coupled to the second metal layer.

16. The apparatus of claim 15, wherein the first and second metal layers are the same.

17. The apparatus of claim 11, wherein the apparatus is a wafer level package (WLP) semiconductor device configured to be coupled to the IC, the IC including an integrated passive device (IPD) pad.

18. The apparatus of claim 17, wherein the first metal layer is extends through the first cavity and is directly coupled to the IPD pad of the IC.

19. The apparatus of claim 11, wherein the first means for integrated passive functionality is configured to be electrically coupled to the interconnect means through the first metal layer and the apparatus is configured to be coupled to the IC.

20. The apparatus of claim 11, wherein the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

21. A method for providing a device, comprising:
providing a substrate;
forming a first cavity traversing the substrate;
forming a first metal layer coupled to a first side wall of the substrate and extending along a length of the first cavity;
forming an interconnect, the interconnect formed from a first solder ball formed within the first cavity and distinct from the first metal layer, that extends through the first cavity;
coupling the interconnect to the first metal layer;
coupling the interconnect directly to a ball pad on an integrated circuit (IC) disposed at a first side of the substrate and to a printed circuit board disposed at a second side of the substrate opposite the first side of the substrate; and
forming a first integrated passive device (IPD) on a first surface of the substrate, the first IPD distinct from and coupled to the first metal layer.

22. The method of claim 21, wherein the forming the interconnect includes forming the interconnect from a single a solder ball.

23. The method of claim 21, wherein the first IPD is one of at least a capacitor, an inductor and/or a resistor.

24. The method of claim 21, further comprising forming a second integrated passive device (IPD) on a second surface of the substrate, the second IPD coupled to the first metal layer.

25. The method of claim 21, further comprising:
forming a second metal layer coupled to a second side wall of the substrate and extending along the length of the first cavity; and
forming a second integrated passive device (IPD) on the first surface of the substrate, the second IPD coupled to the second metal layer.

26. The method of claim 25, wherein the first and second metal layers are the same.

27. The method of claim 21, wherein the device is wafer level package (WLP) semiconductor device configured to be coupled to the IC, the IC including an IPD pad.

28. The method of claim 27, wherein forming the first metal layer includes extending the first metal layer through the first cavity and directly coupling the first metal layer to the IPD pad of the IC.

29. The method of claim 21, wherein forming first IPD includes electrically coupling the first IPD to the interconnect through the first metal layer.

30. The method of claim 21, wherein the device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

\* \* \* \* \*